United States Patent
Chen et al.

(10) Patent No.: US 7,521,724 B2
(45) Date of Patent: Apr. 21, 2009

(54) LIGHT EMITTING DIODE PACKAGE AND PROCESS OF MAKING THE SAME

(75) Inventors: Ming-Hung Chen, Hsinchu (TW);
Shih-Yi Wen, Hsinchu (TW);
Wu-Cheng Kuo, Hsinchu (TW);
Bing-Ru Chen, Hsinchu (TW); Jui-Ping Weng, Hsinchu (TW); Hsiao-Wen Lee, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 359 days.

(21) Appl. No.: 11/147,185

(22) Filed: Jun. 8, 2005

(65) Prior Publication Data

US 2006/0138436 A1    Jun. 29, 2006

(30) Foreign Application Priority Data

Dec. 29, 2004    (TW) .............................. 93141222 A

(51) Int. Cl.
| | |
|---|---|
| H01L 29/06 | (2006.01) |
| H01L 31/00 | (2006.01) |
| H01L 29/26 | (2006.01) |
| H01L 33/00 | (2006.01) |
| H01L 31/12 | (2006.01) |
| H01L 21/00 | (2006.01) |
| H01L 21/76 | (2006.01) |

(52) U.S. Cl. .............................. 257/95; 257/13; 257/21; 257/53; 257/79; 257/81; 257/82; 257/88; 257/98; 257/99; 257/100; 438/106; 438/107; 438/108; 438/109; 438/453

(58) Field of Classification Search ........................ None
See application file for complete search history.

(56) References Cited

U.S. PATENT DOCUMENTS

| | | | | |
|---|---|---|---|---|
| 5,377,031 A | * | 12/1994 | Vu et al. ........................ | 349/45 |
| 5,763,903 A | * | 6/1998 | Mandai et al. ............... | 257/186 |
| 6,531,328 B1 | * | 3/2003 | Chen ............................. | 438/26 |
| 6,583,444 B2 | * | 6/2003 | Fjelstad ........................ | 257/82 |
| 6,599,768 B1 | * | 7/2003 | Chen ............................. | 438/22 |
| RE38,437 E | * | 2/2004 | Floyd et al. .................. | 359/201 |
| 6,974,712 B2 | * | 12/2005 | Ouchi et al. .................. | 438/29 |
| 7,262,440 B2 | * | 8/2007 | Choi et al. .................... | 257/99 |
| 2003/0080341 A1 | * | 5/2003 | Sakano et al. ................. | 257/79 |
| 2005/0029643 A1 | * | 2/2005 | Koyanagi ..................... | 257/680 |
| 2005/0202651 A1 | * | 9/2005 | Akram ......................... | 438/463 |
| 2006/0198162 A1 | * | 9/2006 | Ishidu et al. ................. | 362/623 |

* cited by examiner

*Primary Examiner*—Matthew Smith
*Assistant Examiner*—James M Mitchell
(74) *Attorney, Agent, or Firm*—Harness, Dickey & Pierce, P.L.C.

(57) ABSTRACT

A light emitting diode (LED) package and process of making the same includes a silicon-on-insulator (SOI) substrate that is composed of two silicon based materials and an insulation layer interposed therebetween. The two silicon based materials of silicon-on-insulator substrate are etched to form a reflective cavity and an insulation trench, respectively, for dividing the silicon-on-insulator substrate into contact surfaces of positive and negative electrodes. A plurality of metal lines are then formed to electrically connect the two silicon based materials such that the LED chip can be mounted on the reflective cavity and electrically connected to the corresponding electrodes of the silicon-on-insulator substrate by the metal lines. Thus the properties of heat resistance and heat dispersal can be improved and the process can be simplified.

37 Claims, 12 Drawing Sheets

LIGHT EMITTING DIODE PACKAGE AND PROCESS OF MAKING THE SAME

BACKGROUND

1. Field of Invention

The invention relates to a light emitting diode (LED) package and process of making the same, and in particular to a light emitting diode package that uses silicon-on-insulator as a substrate and process of making the same.

2. Related Art

Conventional SMD LED (Surface mount device LED) packages include two types: A lead frame type and a circuit board type. The lead frame type uses a metal frame and a heat resistance plastic to inject molding for forming a base, which is used to fix an LED chip. The circuit board type uses a composite circuit board as a substrate and then continues the steps of chip fixing, wire bonding and sealing. The two types both have disadvantages, such as low heat resistance, which result in the defects of the SMD LED, especially when the bonding of the SMD LED and other circuit boards requires high-temperature furnace processes (about 250~300° C.). Another disadvantage is poor heat dispersal. Heat accumulates during the operation of the LED, especially for a high power LED. The rising temperature affects the light emitting efficiency and the quality of the LED. In addition, it is difficult to make a reflective cavity in the conventional SMD LED process while scaling it down.

The prior art provides a process of packaging LEDs. As shown in FIG. 1, it uses a silicon substrate as the package substrate. The front surface of the silicon substrate 8 has spectacular crystallizing direction for etching a cavity, and the back surface of the silicon substrate is used for forming a through hole electrode 13. After an insulation layer 15, reflective layer 16 and electrode layers 17 and 18 are formed, a base is formed for disposing the LED chip 3. The LED process is completed after the processes of chip fixing, wire bonding, sealing and cutting. This technique has the advantages of good heat resistance, ease in manufacturing the reflective cavity, and good heat dispersal so that the conventional process of packaging the SMD LED is improved. However the technique requires multiple furnace processes for growing the insulation layer, which complicate the technique. Thus, there is a need for an easier process of packaging an LED, which improves heat resistance and heat removal properties, and also solves the problem of manufacturing the reflective cavity.

SUMMARY

One objective of the invention is to provide a light emitting diode (LED) package and process of making the same, which uses silicon-on-insulator (SOI) as the substrate and forms a reflective cavity on the silicon-on-insulator (SOI) substrate to dispose an LED. Insulation can be done by the insulation layer on the SOI substrate. Therefore, there is no need for further furnace processes to grow an insulation layer. Thus, the advantages of good heat resistance, ease in manufacturing the reflective cavity, good heat dispersal and easier processing can be achieved.

In order to achieve the above objective, a process of making a light emitting diode (LED) package is disclosed. First, a silicon-on-insulator (SOI) substrate is provided. The silicon-on-insulator substrate is composed of a first silicon based material, a second silicon based material, and an insulation layer that is interposed therebetween. The first silicon based material and the second silicon based material of the silicon-on-insulator substrate are then etched to form a reflective cavity and an insulation trench, respectively. The insulation trench divides the silicon-on-insulator substrate into contact surfaces of positive and negative electrodes. Pluralities of metal lines are then formed on the silicon-on-insulator substrate and an LED chip is mounted on the reflective cavity. The positive and negative electrodes of the LED chip electrically connect to the corresponding electrodes of the silicon-on-insulator substrate by the metal lines, respectively.

In order to achieve the above objective, the disclosed light emitting diode (LED) package comprises:

a silicon-on-insulator substrate that is composed of a first silicon based material, a second silicon based material, and an insulation layer interposed therebetween, wherein a reflective cavity is mounted on the first silicon based material, and an insulation trench is located at the bottom of reflective cavity, which divides the substrate into contact surfaces of positive and negative electrodes, and there is a plurality of metal lines on the silicon-on-insulation substrate; and an LED chip, which is on the reflective cavity, wherein positive and negative electrodes of the LED chip electrically connect to corresponding electrodes of the silicon-on-insulator substrate by the metal lines, respectively.

DETAILED DESCRIPTION

Figure 1:
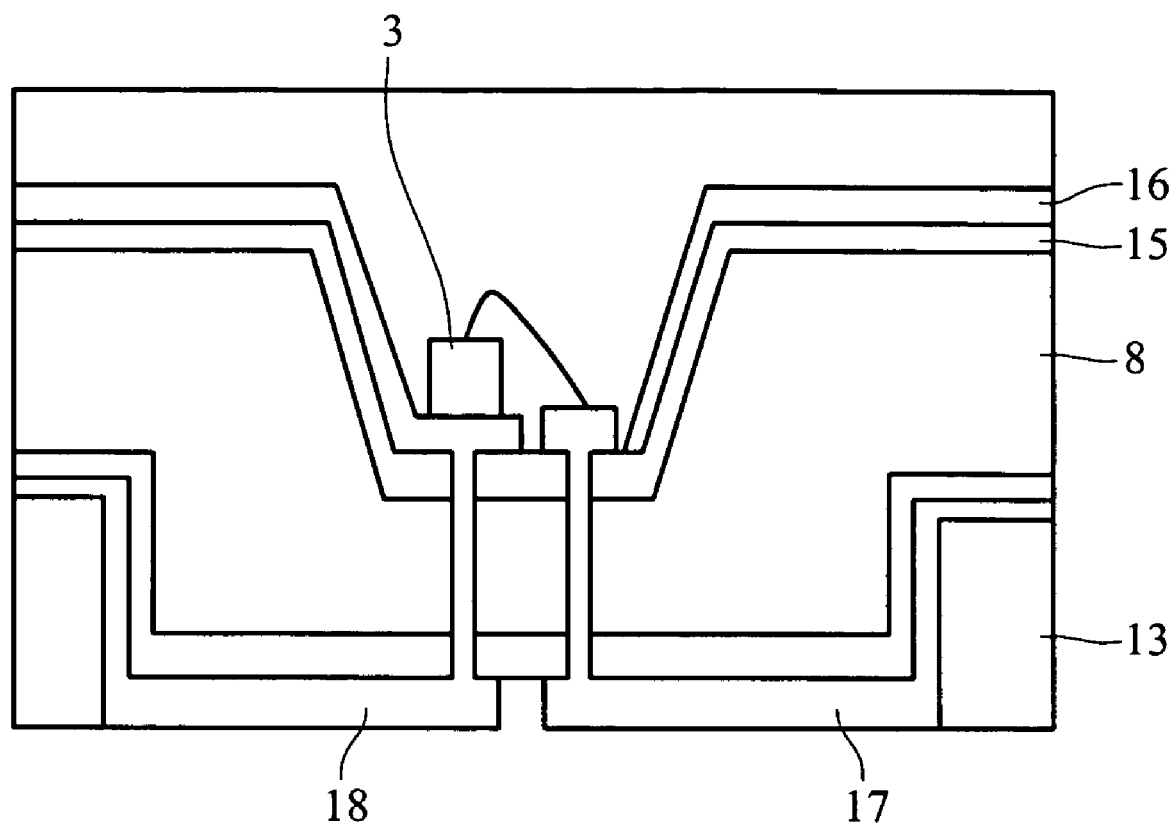
FIG. 1 is a diagram showing the conventional SMD LED device package.
Figure 2:
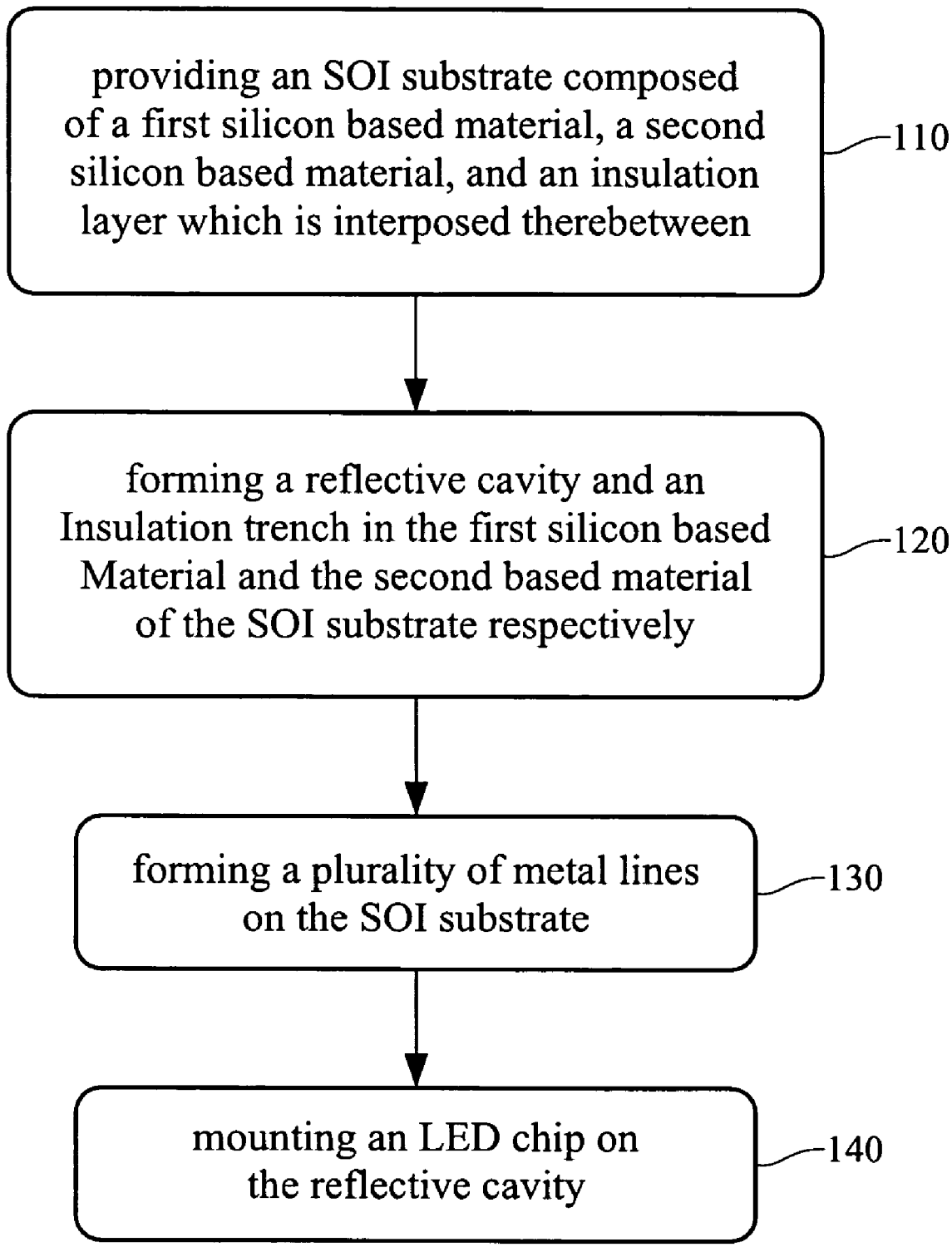
FIG. 2 is a flow chart according to the first embodiment of the invention.

Please refer to FIG. 2, which is a flowchart of first embodiment of the invention. The process includes the following steps. First, a silicon-on-insulation (SOI) substrate, which is composed of a first silicon based material, a second silicon based material and an insulation layer therebetween, is provided (step 110). The materials of the first silicon based material and the second silicon based material may be a semiconductor, which may be electrically-conductive materials. The insulation layer may be electrically-isolated, such as e.g., silicon-oxide, silicon-dioxide, or sapphire, etc. A reflective cavity and an insulation trench are then formed on the first silicon based material and the second silicon based material (step 120). The reflective cavity may be used to reflect the light generated from the LED chip to improve the light-emitting efficiency. A metal line is formed on the SOI substrate for electrically connecting the first silicon based material and second silicon based material of the SOI substrate to the LED chip (step 130). The LED chip is then disposed on the reflective cavity to electrically connect the electrodes of the SOI substrate, which are used to connect to the outside by the metal line (step 140).

The first embodiment of the invention is described below for detailed description of the invention. Please refer to FIGS. 3A to 3D, which show the prospective cross section views of the process.

Figure 3A:
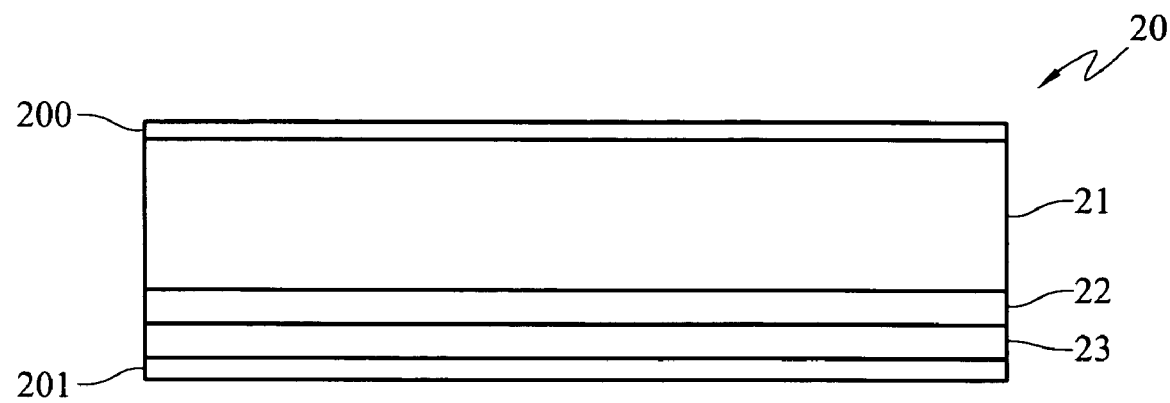
FIGS. 3A to 3E are cross section diagrams showing the process flow according to the first embodiment of the invention.

As shown in FIG. 3A, first, a silicon-on-insulation (SOI) substrate 20 with a first silicon based material 21, a second silicon based material 23 and an insulation layer 22 therebetween is provided. The SOI substrate 20 is put into the furnace to form silicon oxide layers 200 and 201 on the first silicon based material 21 and second silicon based material 23. The silicon oxide layers 200 and 201 are used as a mask for wet etching. Next, a photo resist is coated on the silicon oxide layers 200 and 201, which are located on the two sides of the SOI substrate 20, and a photolithography process is then performed to pattern the photo resist to form an etching region.

Figure 3B:
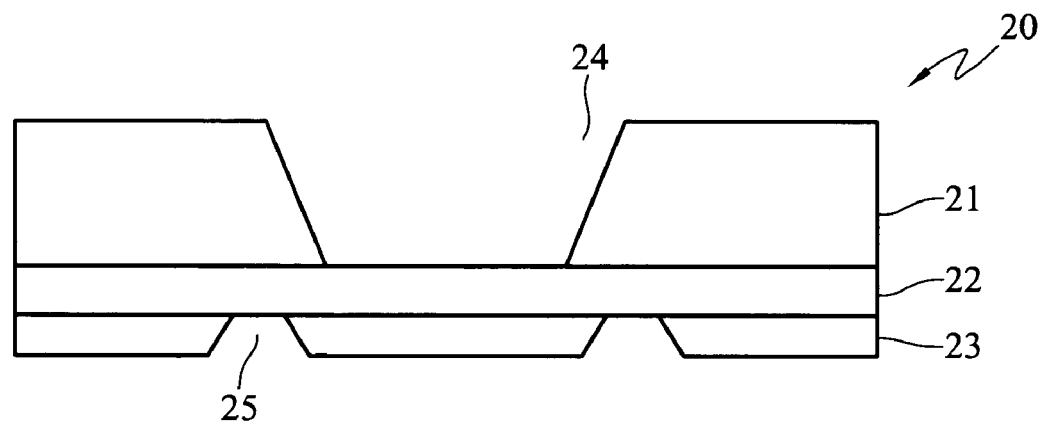

As shown in FIG. 3B, by using an anisotropy etching solution for the silicon substrate (ex: KOH, TMAH, and EDP) to etch the first silicon based material 21 of the SOI substrate 20, a reflective cavity 24 having an inclined plane is formed. Alternatively, the reflective cavity may be formed in a vertical plane. By etching the second silicon based material 23 of the SOI substrate 20, an insulation trench 25 is formed, which forms a contact surface for positive and negative electrodes. The first silicon based material 21 and second silicon based material 23 of the SOI substrate 20 selected in this embodiment have <100> crystallizing directions for etching and forming the inclined plane of the reflective cavity 24. Next the silicon oxide layers 200 and 201 on the first silicon based material 21 and second silicon based material 23 are removed with RIE.

Figure 3C:
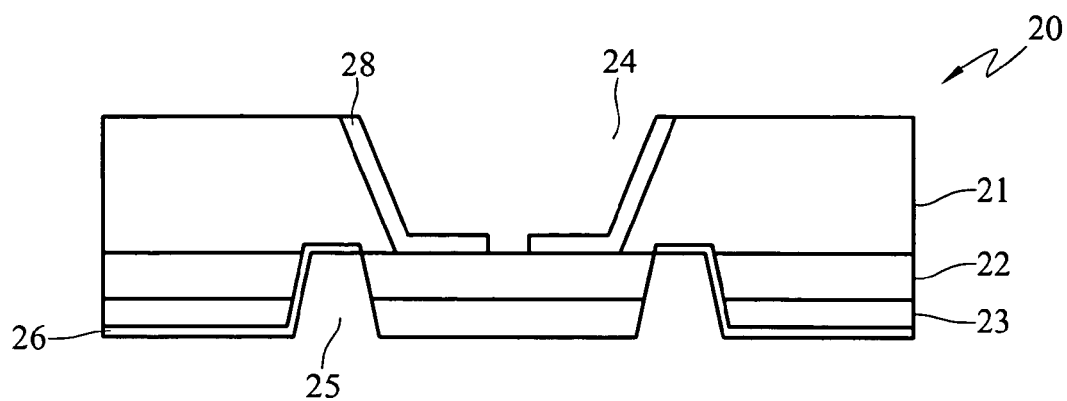

As shown in FIG. 3C, a metal line 28 is formed on the first silicon based material 21 of the SOI substrate 20 by evaporation or a sputtering process in order to electrically connect the LED chip to the first silicon based material 21. A metal line 26 is also formed on the second silicon based material 23 of the SOI substrate 20 for electric connection between the first silicon based material 21 and the second silicon based material 23, and the positive and negative electrodes that connect outside.

Figure 3D:
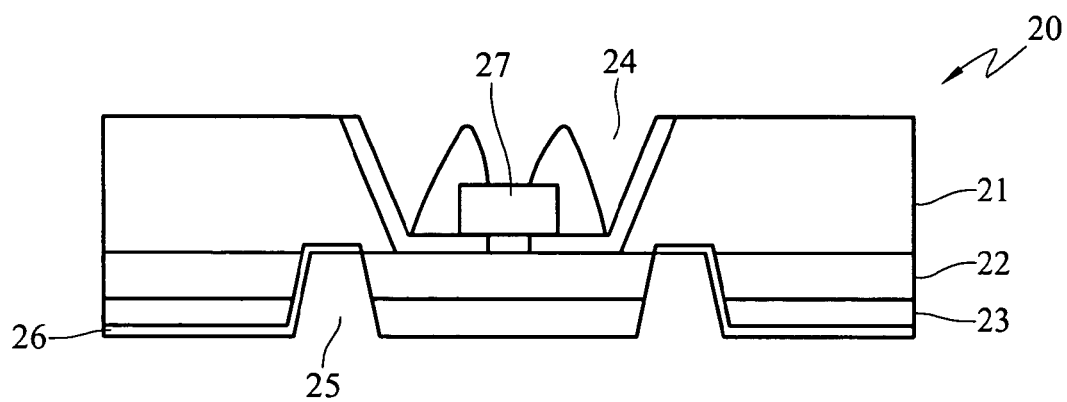

As shown in FIG. 3D, the LED chip 27 is disposed on the reflective cavity 24 and connected to the metal line 28 on the first silicon based material by wire bonding, which makes the positive and negative electrodes of the LED chip 27 connect to the positive and negative electrodes of the SOI substrate 20 by the metal line 26 for transmission.

Figure 3E:
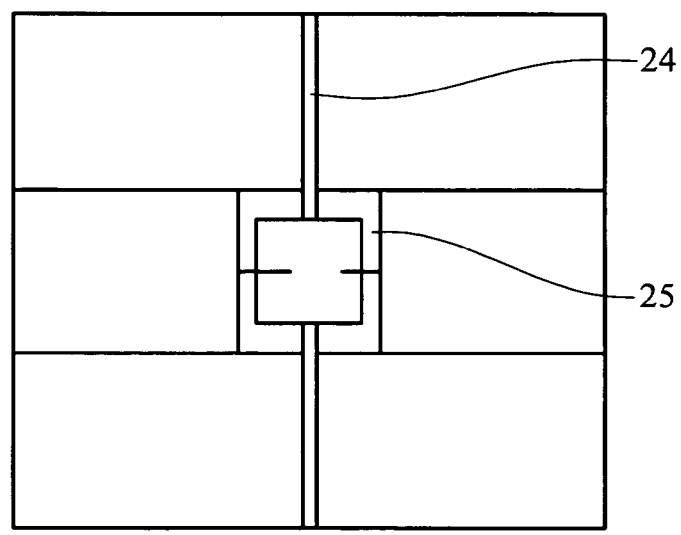

In this embodiment, only four photolithography processes are used. The completed LED package is illustrated in FIG. 3D. Please refer to FIG. 3E, which is a top view of FIG. 3D, and FIG. 3D together. According to the drawing, it includes an SOI substrate 20 and an LED chip 27. The SOI substrate 20 is composed of a first silicon based material 21, a second silicon based material 23 and an insulation layer 22 between the two. There are reflective cavity 24 and an insulation trench 25 on the first silicon based material 21 and second silicon based material 23, respectively. The insulation trench 25 divides the SOI substrate 20 into contact surfaces for positive and negative electrodes. Metal lines 28 are formed for the electric connection between the LED chip and the first silicon based material 21 of the SOI substrate 20, and metal line 26 are formed for electric connection between the first silicon based material 21 and the second silicon based material 23 on the SOI substrate 20. The LED chip 27 is disposed on the reflective cavity 24, and the positive and negative electrodes are connected to the corresponding electrodes of the SOI substrate 20 by metal lines 26.

Figure 4:
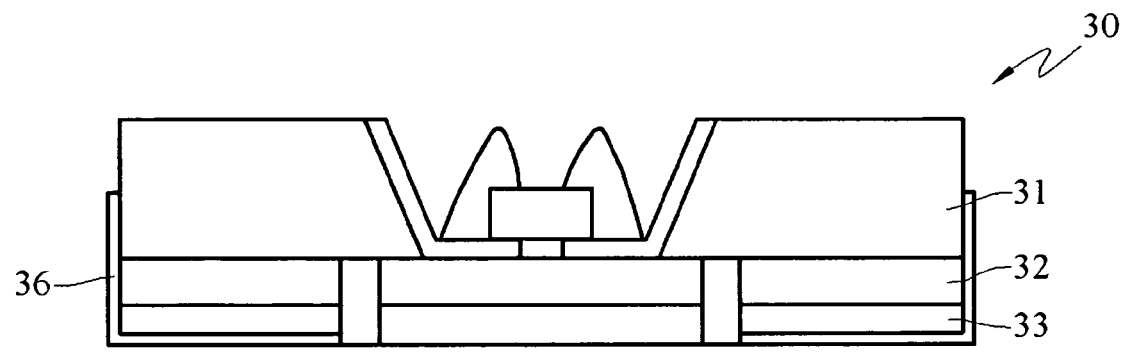
FIG. 4 is a diagram showing the second embodiment of the LED package of the invention.

The LED package provided in the embodiment can use two side low resistance SOI substrate or one side low resistance SOI substrate. That is, the first silicon based substrate 21 has low resistance and the second silicon based substrate 23 has high resistance for providing adjustment and matching of electronic impedance. The insulation layer 22 is between the two, and the insulation trench 25 has metal lines 26 inside for providing a shorter route of electric connection between the positive and negative electrodes of the LED chip 27 and the electrodes of the SOI substrate 20. The positive and negative electrodes of the SOI substrate 20 are for electric connection to the outside. FIG. 4 illustrates the second embodiment of the invention. It can use two side low resistance SOI substrates 30 or one side resistance SOI substrate 30. That is, the first silicon based substrate 31 has low resistance and the second silicone based substrate 33 has high resistance, and an insulation layer 32 is interposed between the two. Because the SOI substrate has lower resistance, the metal lines 26 can be disposed along the side of the SOI substrate 30. Furthermore, the SOI substrate can be a two side low resistance SOI substrate or a one side resistance SOI substrate. For example, the SOI substrate can be either N type or P type, heavily doped with arsenic, antimony and phosphorous, and have a first silicon based material and a second silicon based material with resistance less than $0.1 \ \Omega/cm$. The material of the metal lines can be Ag, Au, Cu, Al, Pt, Pd, Cr, Ni, or an alloy of these metals.

Figure 5:
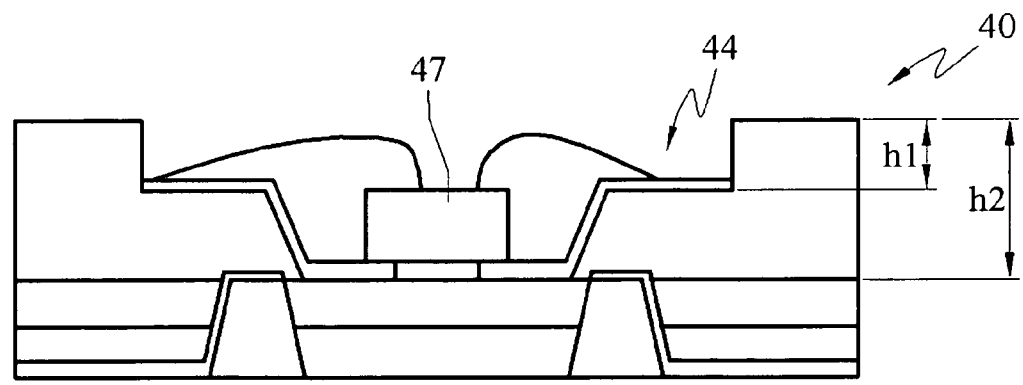
FIG. 5 is a diagram showing the third embodiment of the LED package of the invention.

FIG. 5 illustrates a third embodiment of the invention. The reflective cavity 44 has double depth that consists of a first depth h1 and a second depth h2. The upper layer of the reflective cavity 44 is for the LED chip 47 to wire bond to the electrodes of the SOI substrate 40 more easily.

Figure 6A:
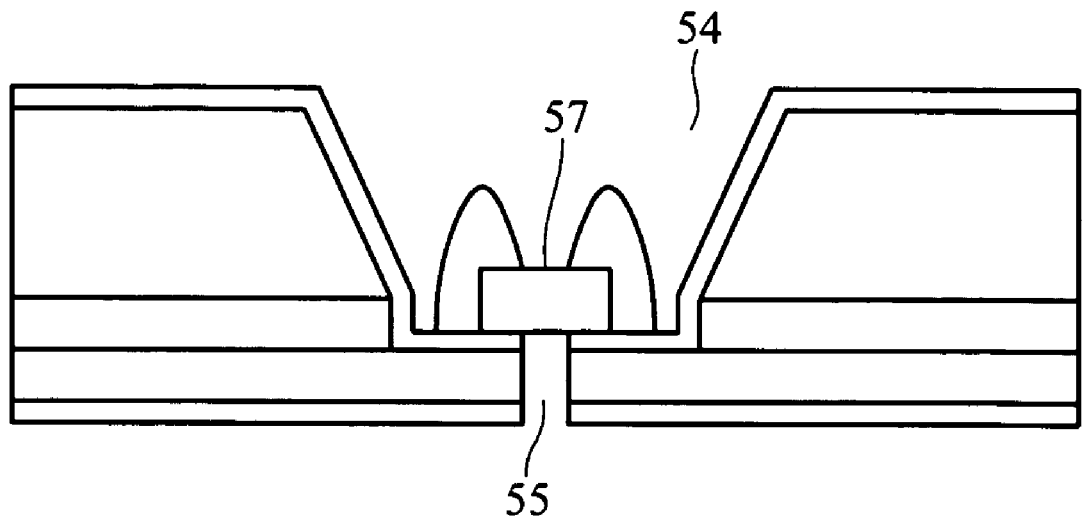
FIG. 6A is a diagram showing the fourth embodiment of the LED package of the invention.
Figure 6B:
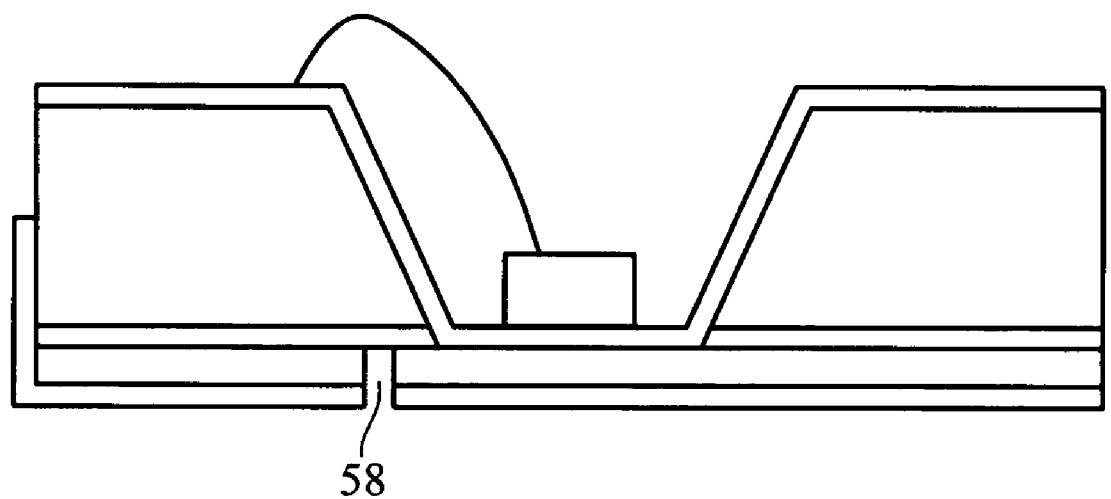
FIG. 6B is a diagram showing the insulation trench, which is disposed near the side of the second silicon based material according to the fourth embodiment of the LED package of the invention.

FIG. 6A illustrates a fourth embodiment of the invention. The insulation trench 55 is disposed on the center of the bottom of the reflective cavity 54. The LED chip 57 is placed above. Such a structure is fragile, so the position of the insulation trench 58 in the embodiment can be closer to the outside, as shown in FIG. 6B.

Figure 7A:
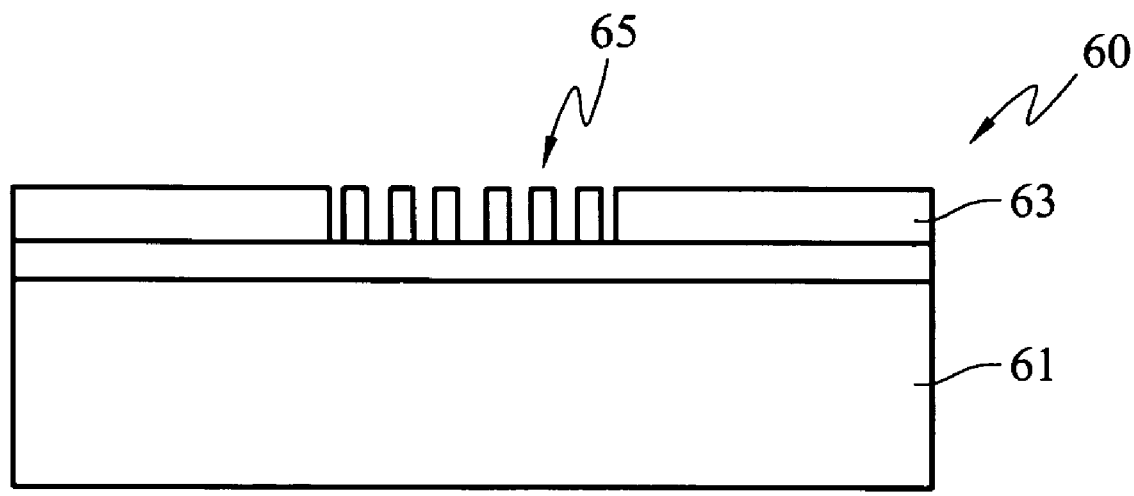
FIGS. 7A to 7C are cross section diagrams showing the process flow according to the fifth embodiment of the invention.
Figure 7B:
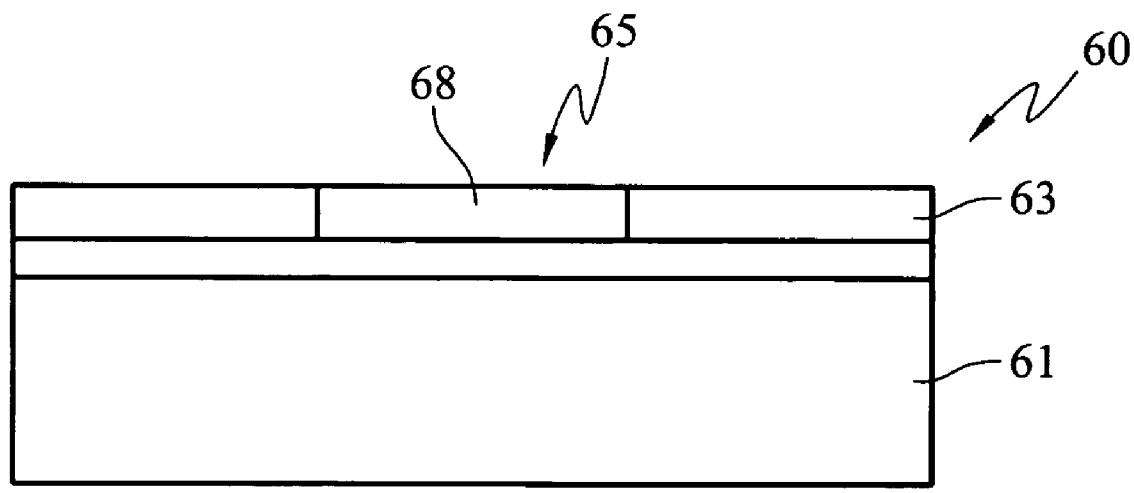
Figure 7C:
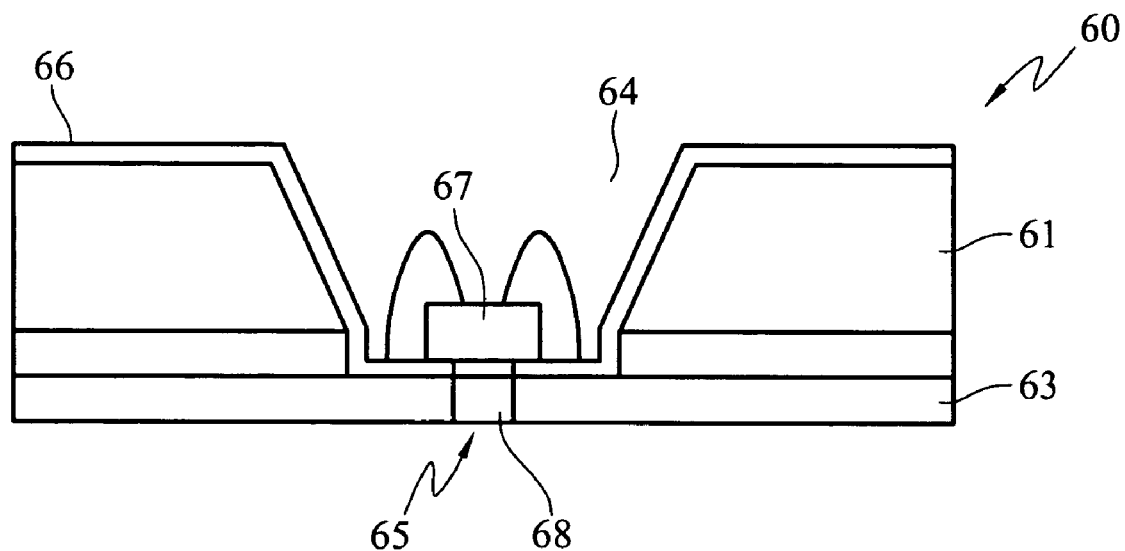

Also, please refer to FIGS. 7A-7C, which are cross section views of the process flow of the fifth embodiment of the invention. According to the drawings, the process of making the LED package of the invention can form an enhanced structure by having an oxide layer in the insulation trench.

The process of making the enhanced structure is described as follows. First, a photography and reactive ion etching (RIE) method are used to form several insulation trenchs 65 in a matrix on the second silicon based substrate 63 of the SOI substrate 60 (shown in FIG. 7A). The SOI substrate 60 is then put into a furnace to proceed with oxidation to grow an oxide layer 68 for enhancement. Any unnecessary oxide layers 68 on the insulation trench 65 will be removed, completing the enhancement structure of the insulation layer 65 with an oxide layer 68 (shown in FIG. 7B). At the same time, photography and etching methods can be used to form a reflective cavity 64 on the first silicon based material 61. Next, metal lines 66 are formed on two sides of the SOI substrate 60. Finally, LED chip 67 is disposed on the reflective cavity 64 and connected to the metal lines 66 on the SOI substrate 60 by wire bonding (shown in FIG. 7C).

Figure 7D:
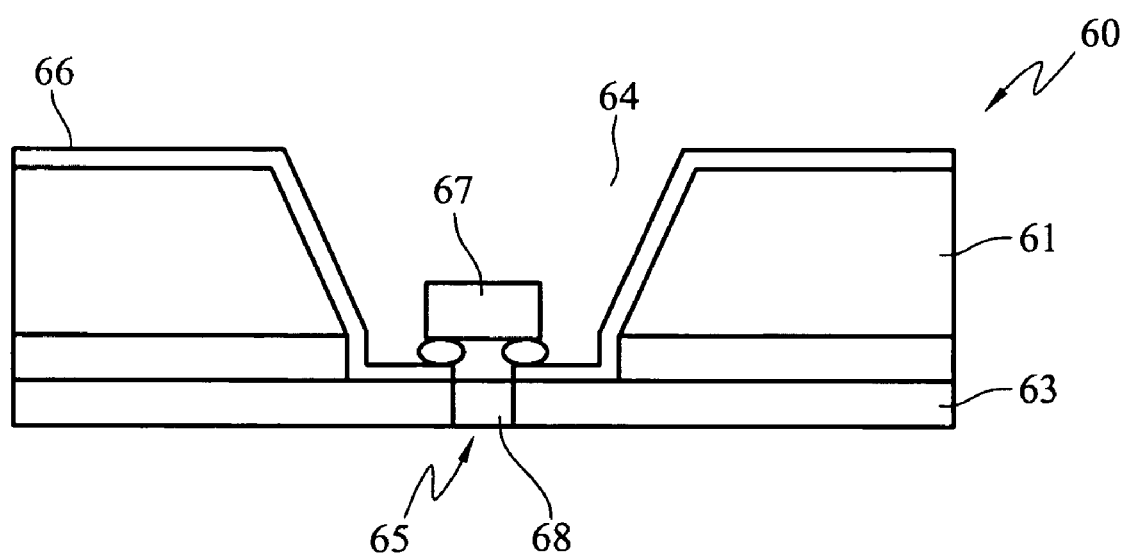
FIG. 7D is a diagram showing the LED chip mounted by a flip chip method according to the fifth embodiment of the invention.

As shown in FIG. 7D, the LED chip 67 can also be mounted in the reflective cavity 64 and have electric connection by a flip chip method.

Figure 8:
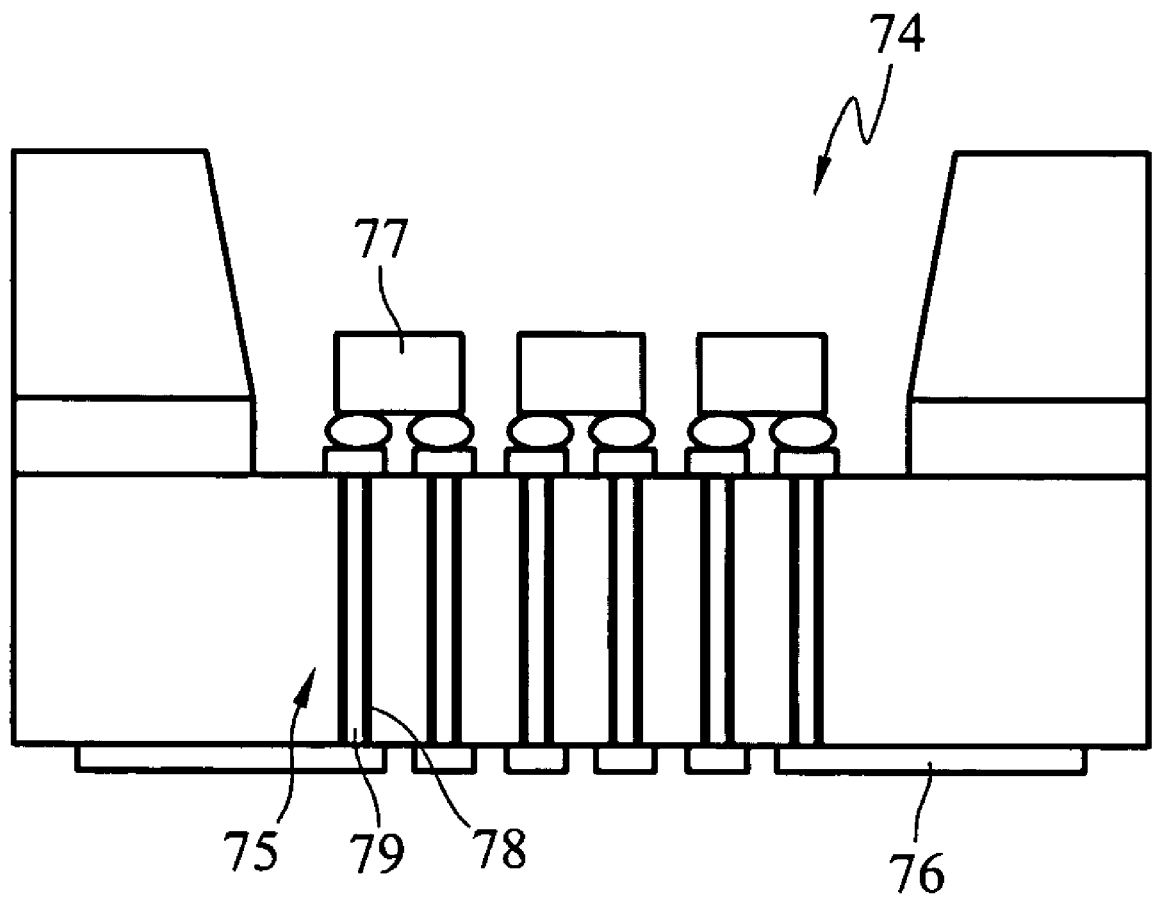
FIG. 8 is a diagram showing the sixth embodiment of the LED package of the invention.
Figure 9A:
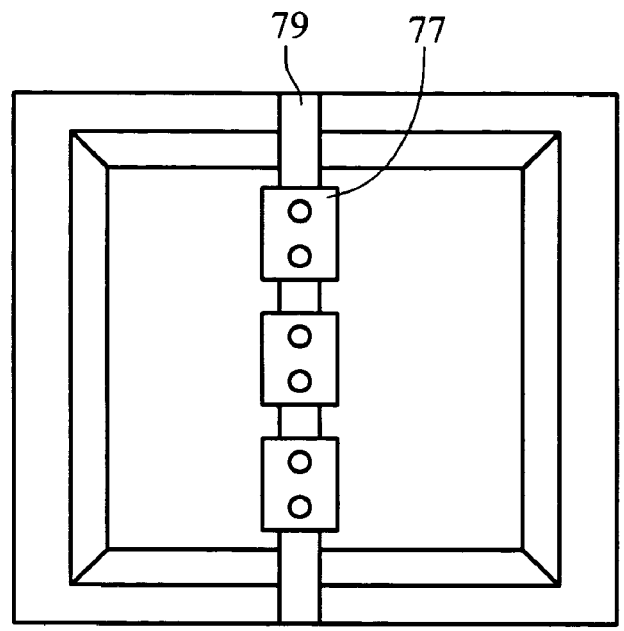
FIGS. 9A and 9B are diagrams showing the serial and parallel connections, respectively, according to the sixth embodiment of the LED package of the invention.
Figure 9B:
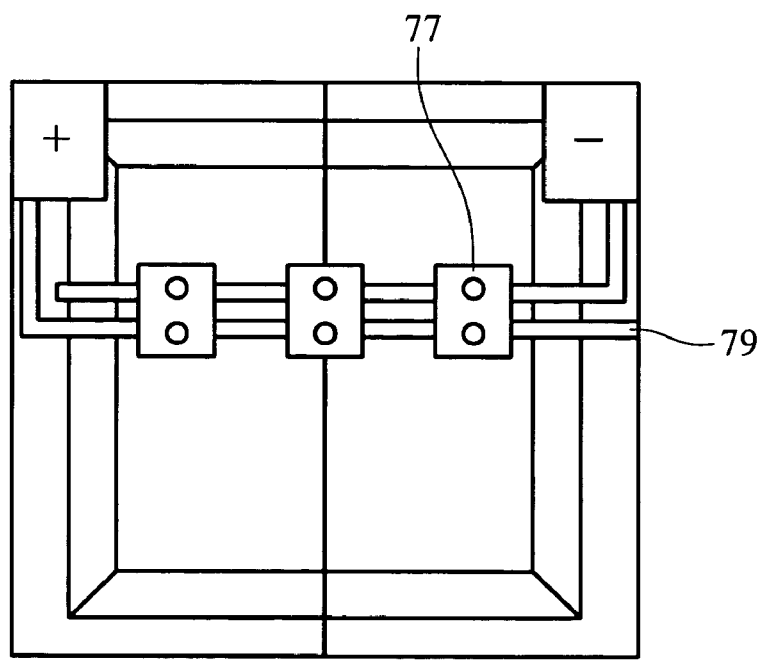

In addition, please refer to FIG. 8, which shows an LED package of the sixth embodiment of the invention. There are several LED chips 77 that are mounted in the reflective cavity 74 by a flip chip method. The LED chips connect to each other by forming an oxide layer 78 in the insulation trench 75 first, and by forming corresponding metal lines 76. Furthermore, according to the variety of designs of the conductive vias 79, the LED chips can have serial (shown in FIG. 9A), parallel (shown in FIG. 9B) or parallel-serial connections.

Figure 10:
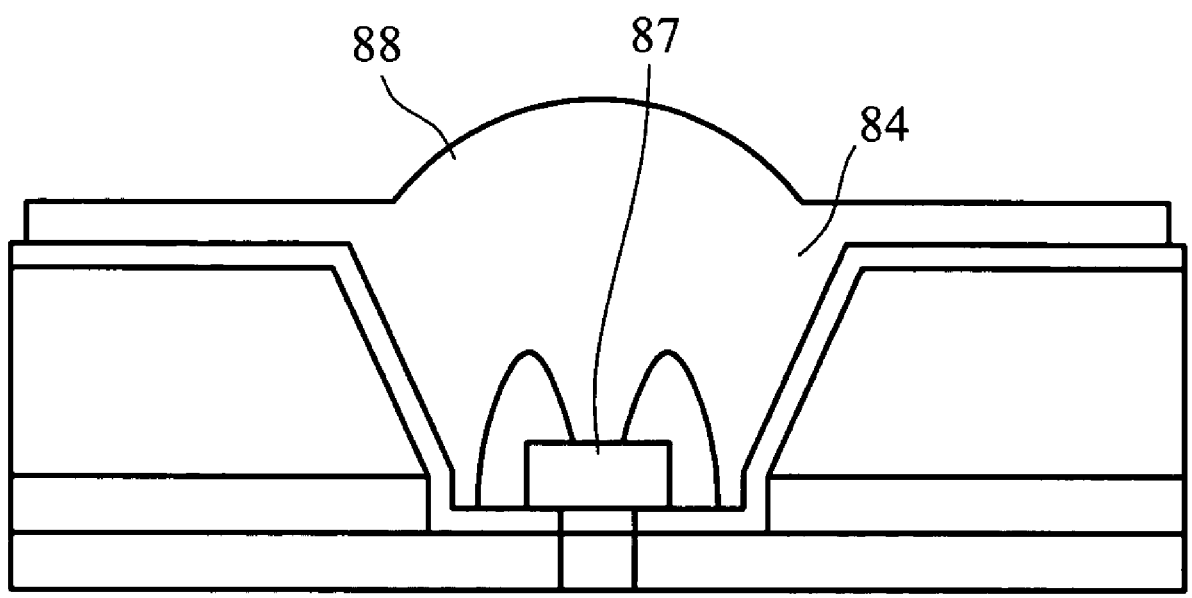
FIG. 10 is a diagram showing the seventh embodiment of the LED package of the invention.

Please refer to FIG. 10, which shows an LED package of the seventh embodiment of the invention. This embodiment further includes encapsulation epoxy 88 to cover the LED chip 87 and fill the entire reflective cavity 84. After heat is provided, the encapsulation epoxy 88 solidifies and become a convex structure. The reflective cavity 84 of the invention is easy to fill.

Figure 11:
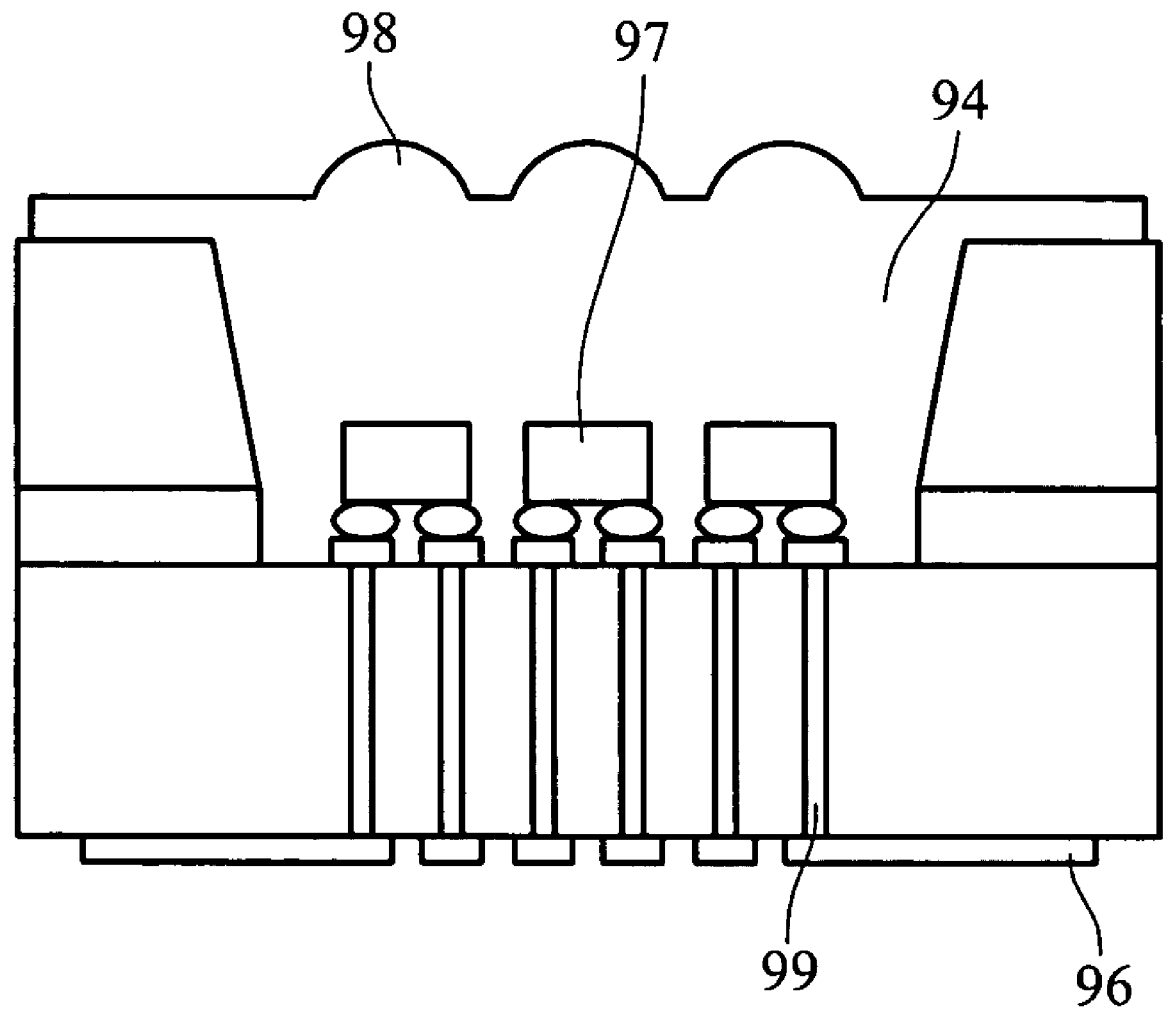
FIG. 11 is a diagram showing the eighth embodiment of the LED package of the invention.

FIG. 11 shows the eighth embodiment of the invention. In this embodiment, the encapsulation epoxy 98 is formed to become several convex structures in the reflective cavity 94. After they combine with the serial LED chips 97, the overall luminance of the LED device is improved. The LED chips 97 are mounted in serial connection by the arrangement of the conductive vias 99 and metal lines 96.

In summary, an LED package and process of making the same have the following advantages. First, using an SOI substrate with the advantages of high temperature resistance and good heat dispersal as the package board improves the reliability of the package. In addition, it is unnecessary to form an insulation layer on the substrate. Thus the process is simplified and the series-parallel connection of the LED chip is easily to accomplish. Therefore the invention further has the advantages of being easy to integrate with the driving circuit, easy to scale down, easy to mass produce and beneficial for market competition.

Although the invention has been described with reference to specific embodiments, this description is not meant to be construed in a limiting sense. Various modifications of the disclosed embodiments, as well as alternative embodiments, will be apparent to persons skilled in the art. It is, therefore, intended that the appended claims will cover all modifications that fall within the scope of the invention.

What is claimed is:

1. A light emitting diode (LED) package, comprising:
   a silicon-on-insulator substrate including a first silicon based material, a second silicon based material, and an insulation layer interposed therebetween, a cavity recessing from the first silicon based material, and at least one insulation trench dividing the silicon-on-insulator substrate into electrically-isolated segments of positive and negative-electrodes,
   a plurality of metal lines formed on the silicon-on-insulator substrate; and
   at least one LED chip, disposed in the cavity, wherein positive and negative electrodes of the LED chip are electrically connected to the metal lines.

2. The package of claim 1 wherein the metal lines comprise a material which is selected from one group consisted of Ag, Au, Cu, Al, Pt, Pd, Cr, Ni and an alloy consisted of above elements.

3. The package of claim 1 wherein the cavity is formed with an inclined plane.

4. The package of claim 1 wherein the cavity is formed with a vertical plane.

5. The package of claim 1 further comprising an encapsulating filling which covers and fills the cavity.

6. The package of claim 5 wherein the encapsulating filling comprises an encapsulation epoxy.

7. The package of claim 6 wherein the encapsulation epoxy forms at least one lens.

8. The package of claim 1 further comprising a dielectric layer filled in the insulation trench.

9. The package of claim 1 further comprises at least one electrically-conductive plug in the insulation trench.

10. The package of claim 9, wherein the LED chips connect to each other in serial, parallel, or parallel-serial connection through the electrically-conductive plug.

11. The package of claim 1, wherein the cavity comprising a first depth and a second depth.

12. The package of claim 1 wherein the LED chip is a flip-chip type LED.

13. The package of claim 1 wherein the first silicon based material has <100> crystalline direction.

14. The package of claim 1 wherein the cavity is capable of reflecting the light generated from the LED chip.

15. A light emitting diode (LED) package, comprising:
   a silicon-on-insulator substrate including a first silicon based material, a second silicon based material, and an insulation layer interposed therebetween, a cavity recessing from the first silicon based material, at least one insulation trench dividing the silicon-on-insulator substrate into electrically-isolated segments of positive and negative electrodes, and a plurality of metal lines formed on the silicon-on-insulator substrate;
   at least one LED chip, disposed in the cavity, wherein positive and negative electrodes of the LED chip are electrically connected to the metal lines, respectively; and
   an encapsulating filling which covers and fills the cavity.

16. The package of claim 15 wherein the encapsulating filling comprises an encapsulation epoxy.

17. The package of claim 16 wherein the encapsulation epoxy forms at least one lens.

18. The package of claim 15 wherein the cavity is formed with an inclined plane.

19. The package of claim 15 wherein the cavity is formed with a vertical plane.

20. The package of claim 15 further comprises at least one electrically-conductive plug in the insulation trench.

21. The package of claim 20 wherein the LED chips connect to each other in serial, parallel, or parallel-serial connection via the electrically-conductive plug.

22. The package of claim 15 wherein the cavity comprises a first depth and a second depth.

23. The package of claim 15 wherein the LED chip is a flip-chip type LED.

24. The package of claim 15 wherein the first silicon based material has <100> crystalline direction.

25. The package of claim 15 wherein the cavity is capable of reflecting the light generated from the LED chip.

26. A light emitting diode (LED) package, comprising:
   a silicon-on-insulator substrate, comprising a first silicon based material, a second silicon based material, an insulation layer interposed therebetween, a cavity recessing from the first silicon based material, a plurality of insulation trenches dividing the silicon-on-insulator substrate into electrically-isolated segments of positive and negative electrodes, the insulation trenches being disposed with a dielectric layer, a plurality of metal lines formed on the silicon-on-insulator substrate; and at least one LED chip, disposed in the cavity, wherein positive and negative electrodes of the LED chip electrically connect to the metal lines respectively.

27. The package of claim 26 wherein the cavity is formed with an inclined plane.

28. The package of claim 26 wherein the cavity is formed with a vertical plane.

29. The package of claim 26 further comprising an encapsulating filling which covers and fills the cavity.

30. The package of claim 29 wherein the encapsulating filling comprises an encapsulation epoxy.

31. The package of claim 30 wherein the encapsulation epoxy forms at least one lens.

32. The package of claim 26 further comprises at least one electrically-conductive plug in the insulation trenches.

33. The package of claim 32 wherein the LED chips connect to each other in serial, parallel, or parallel-serial connection via the electrically-conductive plug.

34. The package of claim 26 wherein the cavity comprising a first depth and a second depth.

35. The package of claim 26 wherein the LED chip is a flip-chip type LED.

36. The package of claim 26 wherein the first silicon based material has <100> crystalline direction.

37. The package of claim 26 wherein the cavity is capable of reflecting the light. generated from the LED chip.

* * * * *